United States Patent [19]

Ohta et al.

[11] Patent Number: 4,991,228
[45] Date of Patent: Feb. 5, 1991

[54] MICROWAVE CONVERTER

[75] Inventors: Tomozo Ohta, Ikoma; Masao Miyazaki, Tenri; Naoki Okamoto, Nara, all of Japan

[73] Assignee: Sharp Kabushiki Kaisha, Osaka, Japan

[21] Appl. No.: 500,215

[22] Filed: Mar. 28, 1990

Related U.S. Application Data

[63] Continuation of Ser. No. 218,860, Jul. 14, 1988, abandoned.

[30] Foreign Application Priority Data

Jul. 15, 1987 [JP] Japan ................................ 62-176881
Jul. 21, 1987 [JP] Japan ................................ 62-181390

[51] Int. Cl.$^5$ ................................................ H04B 1/08
[52] U.S. Cl. ....................................... 455/323; 455/328; 455/300; 455/347
[58] Field of Search ............... 455/323, 328, 325, 327, 455/338, 300, 347

[56] References Cited

U.S. PATENT DOCUMENTS

| | | | |
|---|---|---|---|
| 3,197,703 | 7/1965 | Mongeon | 455/81 |
| 4,232,401 | 11/1980 | Chang et al. | 455/328 |
| 4,461,041 | 7/1984 | Dubrovolny | 455/328 |
| 4,547,901 | 10/1985 | Shibata et al. | 455/300 |
| 4,641,369 | 2/1987 | Grote et al. | 455/327 |
| 4,691,376 | 9/1987 | Watanabe et al. | 455/327 |
| 4,742,571 | 5/1988 | Letron | 455/327 |
| 4,777,654 | 10/1988 | Conti | 455/327 |

FOREIGN PATENT DOCUMENTS 2010036 6/1979 United Kingdom.

OTHER PUBLICATIONS

"New Ku-Band Low Noise Converter Directly Coupled with Helical Antenna" to Ohta et al.
"12-GHz Low-Noise Converters for World Wide Satellite-TV Reception Applications" to Shibata et al. 15th European Microwave Conference, Palais Des Congres, Paris, France, Sep. 9-13th, 1985.

Primary Examiner—Douglas W. Olms
Assistant Examiner—Ralph Smith

[57] ABSTRACT

A microwave converter comprises circuit components formed on the outer surfaces of a three-dimensional body. The inner surfaces of the body constitute a grounding surface. A local oscillator is disposed on one of the inner surfaces. The three-dimensional body may be an electrically conductive body having a hollow space in which the local oscillator is disposed.

19 Claims, 5 Drawing Sheets

FIG. 4
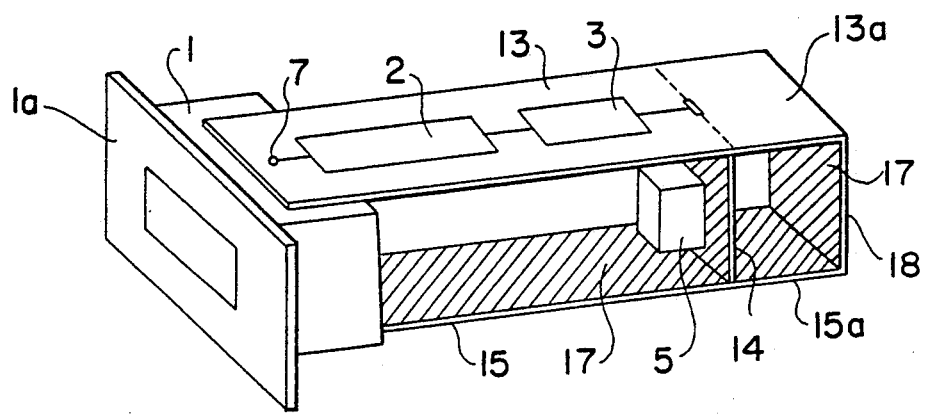
FIG. 5
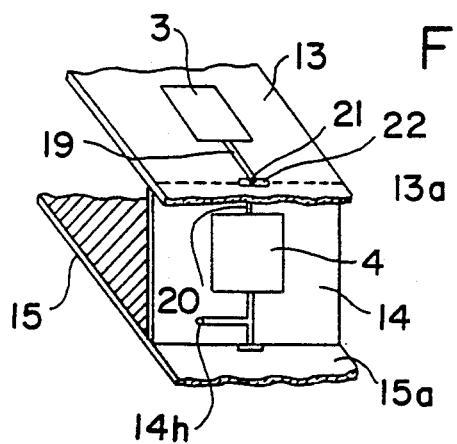
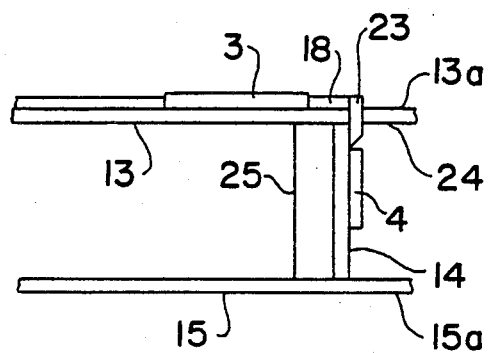
FIG. 6

MICROWAVE CONVERTER

This application is a continuation of application Ser. No. 07/218,860 filed on July 14, 1988, now abandoned.

BACKGROUND OF THE INVENTION

1. Field of the Invention

This invention relates to a microwave converter, more particularly, to improvements in a circuit configuration for developing a small-sized and compact microwave converter converter for satellite broadcasting.

2. Description of the Prior Art

Recently, satellite broadcasting by a microwave using a broadcasting satellite has been put into practice, and microwave devices which have been used mainly in the industrial field are entering the consumers' field. One example of one such device is a microwave converter for receiving satellite broadcasting. Such a microwave converter has a function as converting a received signal of a UHF band to an IF signal.

Satellite broadcasting is aimed to be received by homes so that a large-sized antenna having a large diameter and used in a satellite communication system is not necessary. In satellite broadcasting, therefore, a large amount of power is used for transmission when compared with that used in satellite communication; This enables the use of a small-sized receiving antenna. However, in order to receive the signals readily at homes with little expense, a satellite broadcasting reception system which employs a smaller antenna than currently used had to be developed. In attempting to solve this problem, a highly efficient antenna, as well as an excellent microwave converter used in connection thereto, have been extensively studied.

With the development of a small-sized antenna, a small-sized and compact microwave converter to be associated with such an antenna had to be developed. Generally, a microwave converter is connected to a primary radiator disposed at a radio focal point of the antenna aperture surface. The primary radiator and microwave converter are supported by a support member extending from an antenna pedestal. When used outdoors, the primary radiator and microwave converter may vibrate because of wind, rain or other elements of nature, causing a shift from the focal point, thereby lowering the receiving efficiency. In order to prevent this problem from arising, the support member should be designed to have sufficient strength and durability. It is necessary to design such a support member to be simple, lightweight and inexpensive, so that the support member is adaptable to a small-sized antenna. A microwave converter of the prior art is considerably bulky and heavy. If such a microwave converter is used, therefore, it is very difficult to solve the above-mentioned problem. Thus, an effective means for solving such a problem is to develop a small-sized and compact microwave converter. It will be appreciated that the realization of a small-sized and compact microwave converter is also effective with respect to the development of a simple, light, handy and inexpensive antenna system even when a conventional antenna is used.

A microwave converter consists mainly of a low noise amplifier, filter, mixer, local oscillator, IF amplifier, power supply, etc. These circuit components except the IF amplifier and power supply are formed by MIC (Microwave Integrated Circuits) which are mainly constructed by microstrip circuits. A significant factor for developing a small-sized and compact microwave converter lies in arranging the circuit components effectively.

Microwave converters of the prior art will be described in more detail with reference to the drawings. FIG. 10 shows a view illustrating schematically the internal arrangement of a prior art microwave converter. In the microwave converter, a microwave signal is transmitted from a waveguide coaxial converter 1 to a low noise amplifier 2 through a microwave signal input terminal 7, and further to a mixer 4 through a filter 3. In the mixer 4, the microwave signal is then mixed with a local oscillating signal from a local oscillator 5, thereby converting the signal at the microwave frequency to an IF signal. The IF signal is sent to an IF amplifier 6, and the output signal of the IF amplifier 6 is then supplied via an output terminal 8 to a demodulator (not shown). A power supply 9 supplies a bias voltage to each circuit. The low noise amplifier 2, filter 3, local oscillator 5, etc. are formed on a dielectric board 10 using mainly microstrip circuits. The circuit components may be assembled integrally on one board or substrate, or they may be assembled individually on a plurality of boards which are then assembled on a base. Since frequencies of the IF amplifier 6 and power supply 9 are relatively low, they may be formed on a separate board. In the prior art example shown in FIG. 10, the main circuit components are arranged on a flat surface.

FIGS. 11A and 11B show another example of a conventional microwave converter. In the figures, similar reference numerals of FIG. 10 indicate similar circuit components. In the microwave converter of FIGS. 11A and 11B, the circuit components are arranged on two flat surfaces. Each of the main circuit components is formed individually on a board. Some of the components are mounted on one surface of a base 11, and the other components on the opposite surface of the base 11. The base 11 is usually made of a metal plate. The microwave converter of FIGS. 11A and 11B operates in the same manner as that of FIG. 10, and, therefore, its detailed explanation is omitted. The circuit components 2, 3 and 4 arranged on the upper surface of the base 11 may be integrally arranged on one dielectric board. Alternatively, the circuit components 2, 3 and 4 and the IF amplifier 6 may be integrally arranged on one dielectric board.

The local oscillator 5 shown in FIGS. 10 and 11B has an oscillation resonator which is usually a dielectric resonator of the electromagnetic field coupling type. Hence, the local oscillator 5 is enclosed in a metal shield case so that the deterioration of the properties of the oscillator, the fluctuation in oscillation frequency caused by external disturbances, and unwanted radiation due to the local oscillator output may be prevented. Consequently, the local oscillator 5 is constructed in a bulky structure which is large in height as compared to the other circuit components used in the microwave converter.

In the examples of the prior art described above, the following problems are encountered with respect to the development of a small-sized microwave converter.

As shown in FIGS. 10, 11A and 11B, the circuit components constituting a microwave converter are arranged flat so that the overall size of the microwave converter tends to become larger lengthwise and breadthwise. Moreover, the local oscillator 5 protrudes largely because it must be enclosed in a metal shield case. The other circuit components can be formed with the height lower than the height of the metal shield case so that the height of a microwave converter depends upon the height of the metal shield case, resulting in that the overall dimensions of the converter become large, particularly in height. It has been desired to develop a novel circuit configuration which can solve the aforementioned problems so as to construct a smaller microwave converter.

SUMMARY OF THE INVENTION

The microwave converter of this invention, which overcomes the above-discussed and numerous other disadvantages and deficiencies of the prior art, comprises circuit components including a local oscillator, wherein the circuit components except at least the local oscillator, are mounting on at least one of the outer surfaces of a three-dimensional body; The inner surfaces of the body constitute a grounding surface, and said local oscillator is disposed on one of said inner surfaces.

In a preferred embodiment, the output terminal of said local oscillator is electrically connected to one of said circuit components formed on the outer surfaces via a hole formed in said body.

In a preferred embodiment, the body is made of a dielectric material.

In a preferred embodiment, the dielectric body consists of a plurality of dielectric boards.

In a preferred embodiment, the local oscillator is disposed on the inner surface of one of said dielectric boards.

In a preferred embodiment, the dielectric body consisting of said plurality of dielectric boards has a U-shaped section.

In a preferred embodiment, two of said boards the inner surfaces of which are facing to each other are extended, an additional dielectric board facing to the outer surface of the board disposed between said two boards, is provided. The additional board is connected to said extended portions of the two boards, and the inner surfaces of the extended portions and the inner surface of said additional board constitute grounding surfaces which enclose one or more circuit components formed on said board disposed between said two boards.

In a preferred embodiment, the one or more circuit components formed on said board disposed between said two boards are electrically connected to circuit components formed on said two board, via holes formed in said extended portions.

The microwave converter of this invention comprises circuit components including a local oscillator, wherein said local oscillator is disposed in a hollow portion formed in an electrically conductive body, said circuit components are formed on at least one board each of which is disposed on one outer surface of said conductive body.

In a preferred embodiment, the output terminal of said local oscillator is electrically connected to one of said circuit components via a hole formed in said body and said board.

In a preferred embodiment, the body is made of a dielectric material.

In a preferred embodiment, the body has a cubic shape.

In a preferred embodiment, the body has a trigonal prism-like shape.

Thus, the invention described herein makes possible the objects of: (1) providing a microwave converter which is small in size; (2) providing a microwave converter in which circuit components are compactly assembled; and (3) providing a microwave converter in which a local oscillator is disposed without outwardly protruding.

According to the invention, circuit components of a microwave converter are mounted on dielectric boards which are assembled into a three-dimensional structure, and therefore the converter can be made compact. A plurality of circuit boards can be arranged three-dimensionally on the flat surfaces of a conductive body surrounding a local oscillator, thereby greatly reducing the overall dimensions of the microwave converter lengthwise and breadthwise. That is, peripheral spaces enclosing the local oscillator having a metal shield case, which previously not been used as the spaces for arranging circuit components in a prior art microwave converter, can now be used effectively as the spaces for arranging the circuit components. Thus, most of the spaces which have been useless in a prior art microwave converter can be utilized as the spaces for arranging the circuit components, thus, enabling the development of a small-sized and compact microwave converter.

BRIEF DESCRIPTION OF THE DRAWINGS

This invention will be better understood and its numerous objects and advantages will become apparent to those skilled in the art by reference to the accompanying drawings as follows:

FIG. 4 is a perspective view showing the third embodiment of a microwave converter according to the invention.

FIG. 5 is a partial perspective view of the embodiment of FIG. 4.

FIG. 6 is a side view showing the fourth embodiment of a microwave converter according to the invention.

DESCRIPTION OF THE PREFERRED EMBODIMENTS

Figure 1:
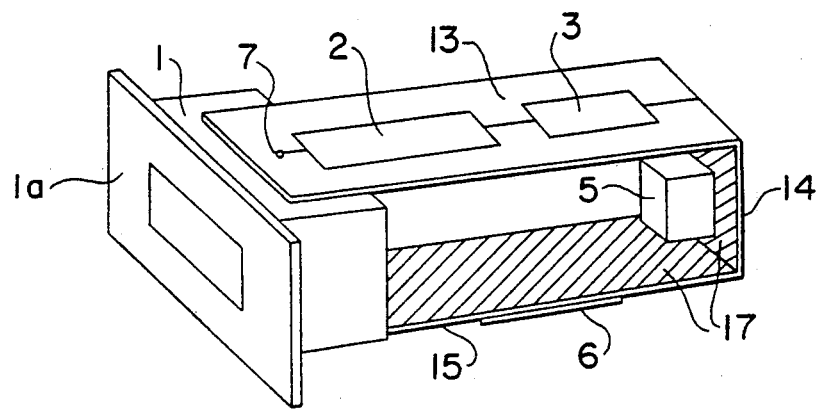
FIG. 1 is a perspective view showing the first embodiment of a microwave converter according to the invention.
Figure 2:
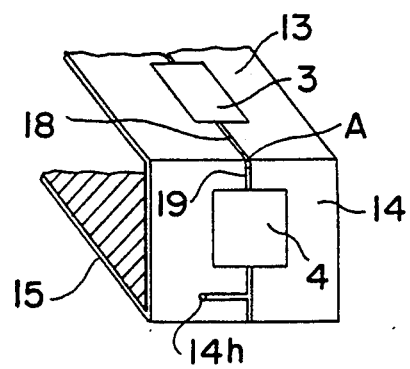
FIG. 2 is a partial perspective view of the embodiment of FIG. 1.

FIG. 1 shows the first embodiment of the invention. In the microwave converter, a signal from a waveguide coaxial transducer 1 having a mounting flange 1a is picked up by an antenna and directed to an input terminal 7 disposed above the waveguide coaxial transducer 1. The microwave converter comprises three component dielectric boards 13, 14 and 15 which are assembled to form a U-shaped structure. The inner surfaces of the dielectric boards 13 to 15 are lined with copper foil 17 which are electrically connected to form a common ground surface. Printed circuits are formed on the outer surfaces of the dielectric boards 13 to 15. An amplifier 2 and filter 3 are disposed on the outer surface of the first dielectric board 13, a mixer 4 (FIG. 2) on the outer surface of the second dielectric board 14, and an IF amplifier 6 on the outer surface of the third dielectric board 15. A local oscillator 5 is disposed in the space surrounded by the three dielectric boards 13 to 15;. The lead of the oscillator 5 penetrates the dielectric board 14 via a through hole 14$h$ (FIG. 2) and is soldered to the circuit pattern formed on the outer surface of the dielectric board 14. Thereby, the local oscillator 5 is electrically connected to the mixer 4 and supported by the second dielectric board 14. These exemplified configurations for interconnecting the circuit components formed on the boards are used mainly for transmitting high frequency signals. Hence, the supply of a bias voltage from a power supply to other circuit components can be conducted by a cable.

The through hole may be replaced with a simple hole. Alternatively, the case of the local oscillator 5 may be fixed to the inner surface of the second dielectric board 14, and connected to the mixer 4 on the outer surface by a cable extending through the hole.

In the above-described arrangement, the mixer 4 is disposed on one surface of the second dielectric board 14 and the local oscillator 5 on the opposite surface of the dielectric board so as to sandwich the dielectric board 14 therebetween. Both are connected with each other through the second dielectric board 14, thereby enabling the output of the local oscillator 5 to be supplied to the mixer 4 by an extremely short distance. Due to the fact the local oscillator 5 is enclosed by at least three component dielectric boards 13, 14 and 15 as mentioned above, the shielding effect to the local oscillator 5 can be greatly improved. Since the outer surfaces are substantially flat, moreover, useless spaces can be eliminated.

Among the circuit patterns formed on the outer surfaces of the dielectric boards 13 to 15, the circuit patterns constituting the signal transmission lines must be connected at each interface of the dielectric boards. The reference A in FIG. 2 indicates the connecting portion of the circuit patterns between the dielectric boards 13 and 14. The transmission circuits on the dielectric boards 13 and 14 are connected with each other, e.g. by soldering, while they remain on the outer surfaces of the dielectric boards.

In the first embodiment having the above-described configuration, the microwave signal of about 12 GHz given from the input terminal 7 passes the amplifier 2 and filter 3 on the first dielectric board 13, and then turns at a right angle to proceed to the mixer 4 on the second dielectric board 14 to be converted down to an IF signal of 1 GHz. The IF signal from the mixer 4 turns at a right angle to enter into the IF amplifier 6 on the third dielectric board 15, and advances to the output terminal 8 (FIG. 3) after amplification by the IF amplifier 6. In this embodiment, the signal advances three-dimensionally (in a U-shaped course) along the three-dimensional structure formed by the dielectric boards 13 to 15. The circuit patterns are formed on the outer surfaces, and the ground surface on the inner surfaces. This arrangement may be reversed. Namely, the ground plane may be formed on the outer surfaces, and the circuit patterns on the inner surfaces.

Figure 3:
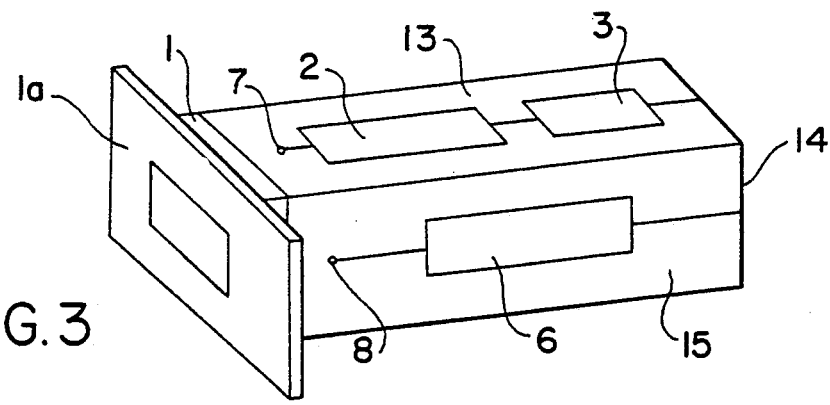
FIG. 3 is a perspective view showing the second embodiment of a microwave converter according to the invention.

The second embodiment of the invention is shown in FIG. 3. This embodiment is constructed in the same way as the first embodiment of FIG. 1 except that the third dielectric board 15 constitutes another side of a cubic body, i.e. it lies perpendicular to both the first and second dielectric boards 13 and 14. In FIG. 3, the numeral 8 indicates the output terminal.

FIG. 4 shows the third embodiment of the invention. The third embodiment is also similar to the first embodiment, however, the first dielectric board 13 and third dielectric board 15 are extended. The extended portions 13$a$ and 15$a$ are connected with each other by a fourth dielectric board 18 which is parallel to the second dielectric board 14. The inner surfaces of the extended portions 13$a$, 15$a$ and fourth dielectric board 18 are lined with copper foil 17 for grounding. According to the configuration of the third embodiment, the mixer 4 which is formed on the second dielectric board 14 is shielded by the extended portions 13$a$, 15$a$ and fourth dielectric board 18. In such a configuration, some measures must be taken to connect the signal transmission circuits 19 and 20 which are formed on the first dielectric board 13 and the second dielectric board 14. In FIG. 5, an L-shaped metal piece 21 is soldered to both the signal transmission circuits 19 and 20 through a hole 22 formed in the first dielectric board 13. The metal piece 21 may be substituted by a solder.

FIG. 6 illustrates another configuration for connecting the signal transmission circuits in which the circuits are connected by a metal piece 23 inserted in a through a hole 24. In the fourth embodiment shown in FIG. 6, the through hole 24 is formed in the first dielectric board 13. The metal piece 23 may be replaced with a solder filled in the hole 24. A reinforcing metal piece 25 is disposed, as shown in FIG. 6, to be in contact with the inner surfaces of the dielectric boards 13, 14 and 15, thereby increasing the reliability of the connection between the grounding surfaces and also improving the mechanical strength of the cubic body.

In the embodiments of FIGS. 1 to 5, a shield case may be disposed individually on the outer surface of each dielectric board. Additionally, a further shield case enclosing the entire microwave converter may be provided. Moreover, one or more boards for reinforcement or heat radiation may be attached to a side surface of the dielectric boards 13, 14 and 15.

Figure 7A:
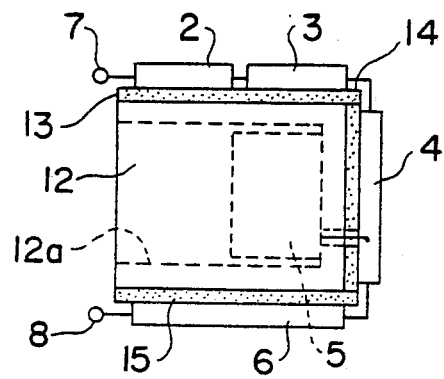
FIGS. 7A and 7B are side views showing the fifth embodiment of a microwave converter according to the invention.
Figure 7B:
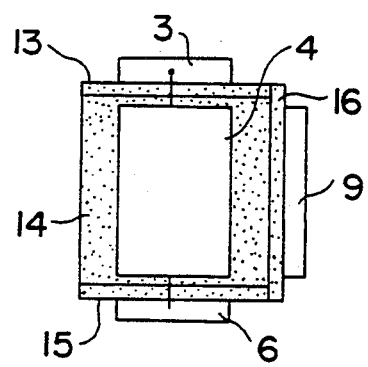

FIGS. 7A and 7B show the fifth embodiment of the invention. The microwave converter of FIGS. 7A and 7B has a rectangular shape as a whole. In this embodiment, the local oscillator 5 is disposed in a hollow space 12$a$ formed in a rectangular body 12 which is electrically conductive. On each of four outer surfaces of the conductive body 12, four dielectric boards 13, 14, 15 and 16 are disposed respectively. The low noise amplifier 2 and filter 3 are formed on the first dielectric board 13; the mixer 4 on the second dielectric board 14; the IF amplifier 6 on the third dielectric board 15; and a power supply 9 on the fourth dielectric board 16. The circuit components 2 to 4, 6 and 9 are disposed on the outer surfaces of the boards 13 to 16. The inner surfaces of the boards 13 to 16 are basically conductive surfaces for grounding, and are bonded to the outer surfaces of the conductive body 12 which function as the ground so that the boards 13 to 16 are commonly grounded. The output of the local oscillator 5 is connected to the input terminal for local 14 oscillating signals of the mixer 4 formed on the second board 14, by a connecting conductor via a hole penetrating both the conductive body 12 and the second board 14.

In the foregoing embodiment, the four boards 13 to 16 are disposed three-dimensionally on four outer surfaces of the conductive body 12, and the local oscillator 5 is situated in the inner space 12a of the conductive body 12. Therefore, useless spaces are eliminated such that a high density mounting can be accomplished, resulting in a small-sized and compact microwave converter. Moreover, a leakage of the local oscillating signal radiated from other than the output terminal of the local oscillator 5 can be effectively shielded because the local oscillator 5 is disposed in the conductive body 12. The way of arranging the local oscillator 5 in the conductive body 12 and the position of its output terminal are not restricted to the above, and can be selected adequately as required.

Figure 8:
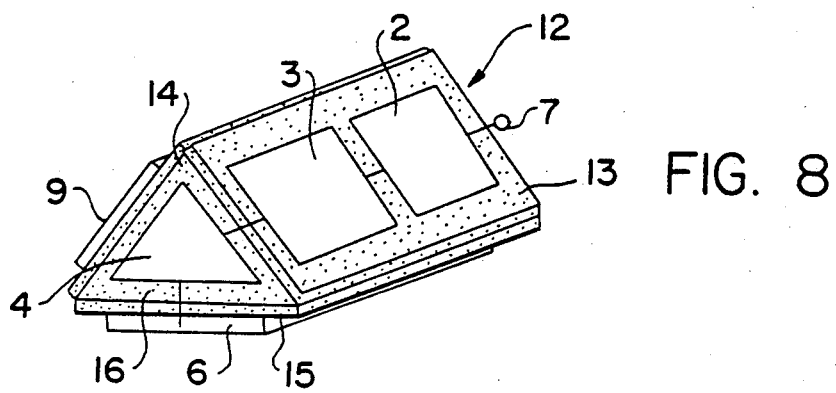
FIG. 8 is a perspective view showing the sixth embodiment of a microwave converter according to the invention.

FIG. 8 shows the sixth embodiment of the invention in which the conductive body 12 is formed into a trigonal prism-like shape. The conductive body 12 has a hollow space in which the local oscillator is disposed. The four dielectric board 13 to 16 on which circuit components are arranged are disposed three-dimensionally on the outer surfaces of the prism-like conductive body 12. Due to such a unique arrangement, circuit components can be mounted more densely, resulting in a smaller microwave converter as compared with that of FIGS. 7A and 7B.

Figure 9A:
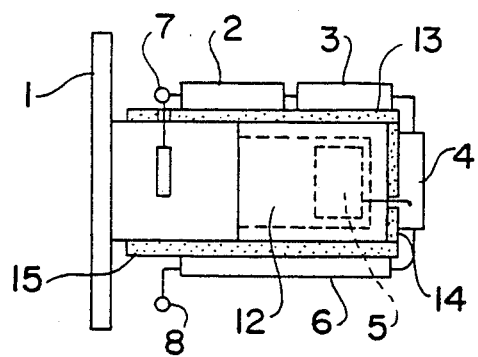
FIGS. 9A and 9B are side views showing the seventh embodiment of a microwave converter according to the invention.
Figure 9B:
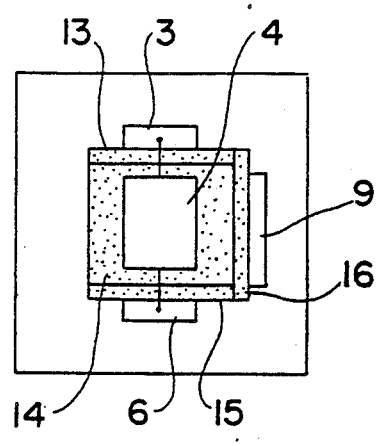
Figure 10:
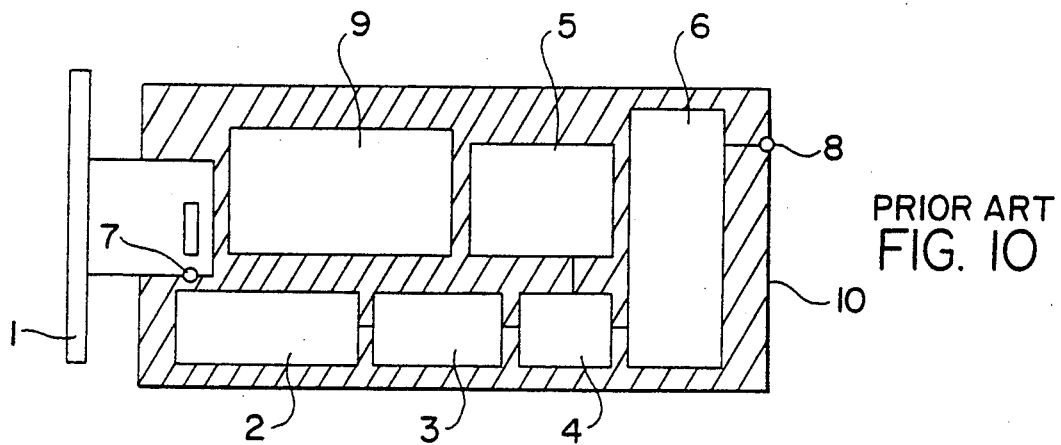
FIG. 10 is a plan view illustrating schematically the internal arrangement of a prior art microwave converter.
Figure 11A:
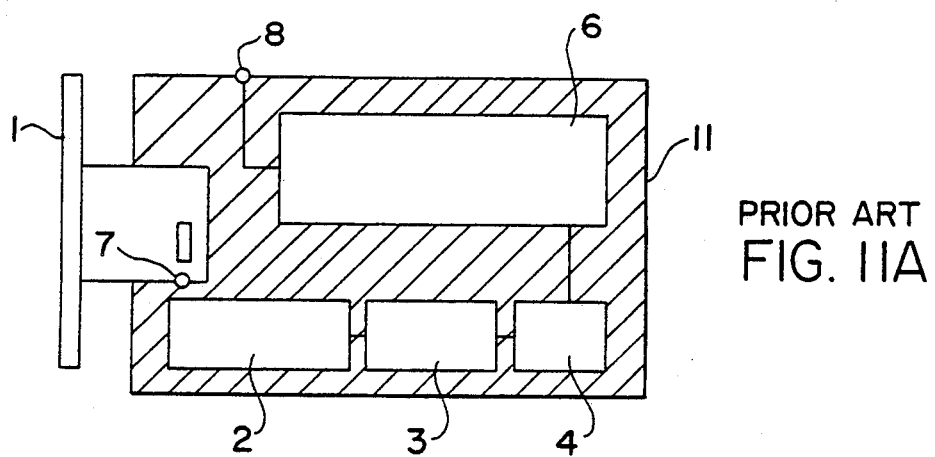
FIG. 11A is a plan view of another example of a prior art microwave converter.
Figure 11B:
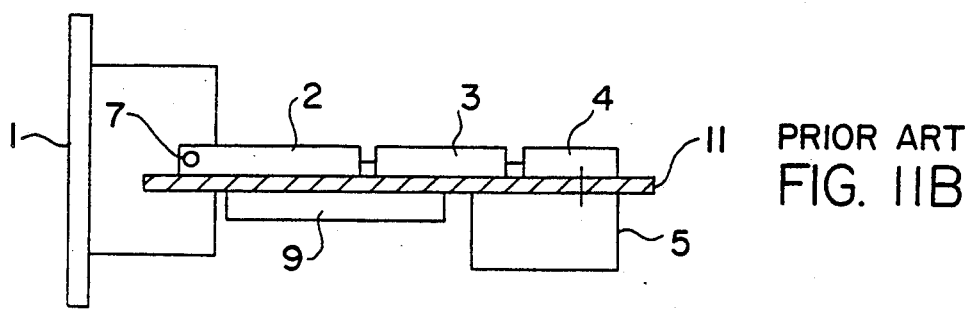
FIG. 11B is a side view of the microwave converter of FIG. 11A.

A microwave converter for satellite broadcasting in which a further embodiment of the invention is employed is illustrated in FIGS. 9A and 9B. This embodiment is a modification of the embodiment shown in FIG. 7. The dielectric boards 13, 15 and 16 disposed on the outer surfaces of the conductive body 12 which encloses the local oscillator 5 are extended. The extended portions of the boards are connected to the waveguide coaxial converter 1 so that the rectangular portion of the coaxial converter 1 is surrounded by the three boards 13, 15 and 16.

Other kinds of circuit components can be used in a microwave converter of the invention. A plurality of dielectric boards may be replaced with a three-dimensional dielectric body.

Although microwave converters for satelite broadcasting have been described as embodiments of the invention, the circuit configuration according to the invention can be advantageously applied to other various microwave equipments.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be constructed as encompassing all the features of patentable novelty that reside in the present invention, including all features that would be treated as equivalents thereof by those skilled in the art to which this invention pertains.

What is claimed is:

1. A compact microwave converter comprising:
a three dimensional body with a plurality of internal and external surfaces, wherein said internal surfaces constitute grounding surfaces;
circuit components mounted on two or more of said plural external surfaces; and
a local oscillator mounted on one of said internal surfaces such that said local oscillator is completely enclosed by said three dimensional body to shield it from external disturbances.

2. A microwave converter according to claim 1, wherein the output terminal of said local oscillator is electrically connected to one of said circuit components mounted on the external surfaces via a hole in said body.

3. A microwave converter according to claim 1, wherein said body is made of a dielectric material.

4. A microwave converter according to claim 3, wherein said dielectric body consists of a plurality of dielectric boards.

5. A microwave converter according to claim 4, wherein said local oscillator is disposed on the internal surface of one of said dielectric boards.

6. A microwave converter according to claim 4, wherein said dielectric body consisting of said plurality of dielectric boards has a U-shaped section.

7. A microwave converter according to claim 6, further comprising:
an extension of two of said boards which are substantially parallel to each other beyond a third board;
an additional board connected to the extended portions of the two substantially parallel boards wherein an extended section is formed by the additional board, the extended portions of the two substantially parallel boards and the third board; and
one or more circuit components mounted in the extended section.

8. A microwave converter according to claim 7, wherein the internal surfaces of the extended portions of the two substantially parallel boards and the internal surface of the additional board all constitute grounding surfaces.

9. A microwave converter according to claim 8, wherein said one or more circuit components mounted in said extended section are electrically connected to circuit components mounted on said two substantially parallel boards, via holes formed in said extended portions.

10. A compact microwave converter comprising:
an electrically conductive body with an internal hollow portion and a plurality of external surfaces;
circuit boards mounted on the external surfaces of the body;
circuit components mounted on two or more of said boards; and
a local oscillator mounted in said internal hollow portion of the body such that said local oscillator is completely enclosed by said three dimensional body to shield it from external disturbances.

11. A microwave converter according to claim 10, wherein the output terminal of said local oscillator is electrically connected to one of said circuit components via a hole in said body and one of said board.

12. A microwave converter according to claim 10, wherein said body is made of dielectric material.

13. A microwave converter according to claim 10, wherein said body has a cubic shape.

14. A microwave converter according to claim 10, wherein said body has a trigonal prism-like shape.

15. A method of creating a small, compact microwave converter comprising the steps of:
constructing a three dimensional body with a plurality of internal and external surfaces at least partly from a plurality of dielectric boards, wherein said internal surfaces constitute a grounding surface;

mounting circuit components on two or more of said plural external surfaces;

mounting a local oscillator on one of said internal surfaces such that local oscillator is completely enclosed by said three dimensional body to shield it from external disturbance; and electrically connecting the output terminal of the local oscillator to one of said circuit component via a hole in said three dimensional body.

16. A method of creating a small, compact microwave converter according to claim 15, wherein the three dimensional body is constructed such that the plurality of dielectric boards has a U-shaped section.

17. A method according to claim 16, further comprising the steps of:

extending two of said boards which are substantially parallel to each other beyond a third board;

providing an additional board which faces an external surface of the third board;

connecting the additional board to the extended portions of the two parallel boards;

forming an extended section of said housing which comprises said extended portions, said third board and said additional board wherein internal surfaces of said extended portions and internal surfaces of the additional board all constitute grounding surfaces; and mounting one or more circuit components within said extended section.

18. A method of creating a small, compact microwave converter comprising the steps of:

constructing an electrically conductive body with an internal hollow portion and a plurality of external surfaces;

mounting circuit boards on the plurality of external surfaces of said body;

mounting circuit components on two or more of said boards; and mounting a local oscillator in said internal hollow portion of said body such that said local oscillator is completely enclosed by said three dimensional body so as to shield it from external disturbances.

19. A method of claim 18, further comprising the step of:

electrically connecting the output terminal of the local oscillator to one of said circuit components via a hole in said body and one of said boards.

* * * * *